(12) United States Patent
Cornwall

(10) Patent No.: US 6,725,668 B1
(45) Date of Patent: Apr. 27, 2004

(54) THERMODYNAMIC CYCLES AND METHOD FOR GENERATING ELECTRICITY

(76) Inventor: Remi Oseri Cornwall, 92B Sutherland Avenue, Biggin Hill, Kent TN16 3HG (GB)

( * ) Notice: Subject to any disclaimer, the term of this patent is extended or adjusted under 35 U.S.C. 154(b) by 0 days.

(21) Appl. No.: 09/959,081

(22) PCT Filed: Apr. 19, 2000

(86) PCT No.: PCT/GB00/01515
§ 371 (c)(1),
(2), (4) Date: Oct. 16, 2001

(87) PCT Pub. No.: WO00/64038
PCT Pub. Date: Oct. 26, 2000

(30) Foreign Application Priority Data

Apr. 19, 1999 (GB) ............................................. 9908912

(51) Int. Cl.⁷ .................... F25B 21/00; H02N 10/00; H02H 7/06; H01F 1/00
(52) U.S. Cl. ........................... 62/3.1; 310/306; 322/29; 322/33; 335/217
(58) Field of Search .................... 62/3.1, 467, 331; 710/306, 11; 322/29, 33; 335/217

(56) References Cited

U.S. PATENT DOCUMENTS

| 2,510,800 | A |   | 6/1950  | Chilowsky |          |
|-----------|---|---|---------|-----------|----------|
| 3,073,974 | A |   | 1/1963  | Hob       |          |
| 4,064,409 | A | * | 12/1977 | Redman    | 310/306  |
| 4,197,492 | A | * | 4/1980  | Sato et al. | 322/28 |
| 4,246,531 | A | * | 1/1981  | Jordan    | 322/28   |
| 4,392,356 | A |   | 7/1983  | Brown     |          |
| 5,105,096 | A | * | 4/1992  | Waldschmidt et al. | 307/68 |
| 5,457,595 | A | * | 10/1995 | Baldwin   | 361/160  |
| 5,714,829 | A |   | 2/1998  | Guruprasad |         |
| 6,320,488 | B1 | * | 11/2001 | Leupold  | 335/306  |

OTHER PUBLICATIONS

Solomon, "Design of a Thermomagnetic Generator," *Energy Convers. Mgmt.* 31:157–173 (1991).

* cited by examiner

*Primary Examiner*—William C. Doerrler
(74) *Attorney, Agent, or Firm*—Klarquist Sparkman, LLP

(57) ABSTRACT

An apparatus for performing a thermodynamic cycle comprising: a sample having a ferromagnetic phase transition temperature; means to magnetise the sample above the ferromagnetic phase transition temperature of the sample; and means to cool the sample to a temperature that is below the ferromagnetic phase transition temperature thereof, wherein the demagnetisation of the sample whilst the sample is below the ferromagnetic phase transition temperature thereof causes the generation of an independent magnetic flux. Also disclosed is a method of converting energy, comprising the steps of: providing a sample having a ferromagnetic transition temperature; magnetising the sample while the sample is above the ferromagnetic transition temperature thereof; allowing the sample to demagnetise while the sample is below the ferromagnetic transition temperature thereof, the demagnetisation of the sample causing an independent magnetic flux; and converting at least some of the independent magnetic flux into an electric current. An analogous ferroelectric apparatus and an analogous ferroelectric method are also presented.

19 Claims, 13 Drawing Sheets

FIG 8
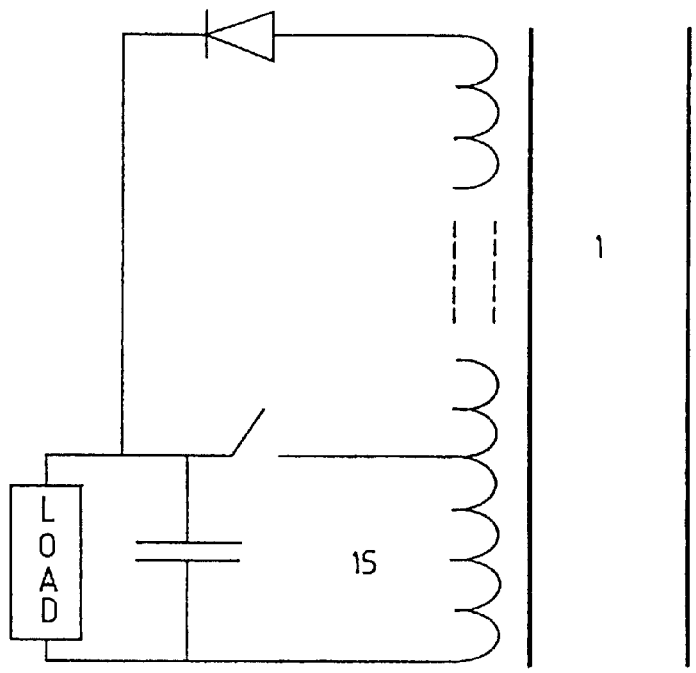
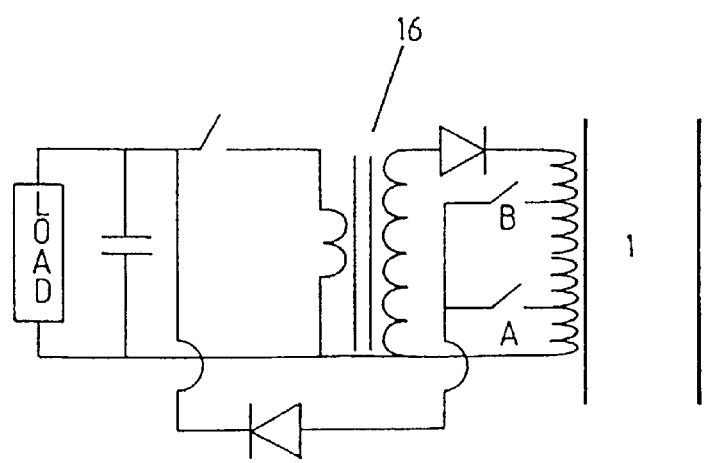
FIG 9

THERMODYNAMIC CYCLES AND METHOD FOR GENERATING ELECTRICITY

This Invention relates to a method and device for converting heat energy into electricity and refrigeration by the use of materials near their Ferromagnetic or Ferroelectric phase transition point; the electro-calorific and magneto-calorific effects or Ferrofluids, Ferro-electric Fluids or Liquid Crystals by non-Carnot and Carnot limited thermodynamic cycles.

Direct conversion of heat into electricity with minimal moving parts is desirable, and electricity is probably the most versatile manifestation of motive power. There are many schemes and devices for directly converting heat into electricity by thermo-couples, Seebeck and Peltier devices. An example of such a device employing the magneto-calorific effect is disclosed in U.S. Pat. No. 5,714,829.

U.S. Pat. No. 4,3912,356 discloses a method of controlling the temperature of an element, and the magnetic field applied thereto, to cause the temperature-magnetism state of the element to traverse a loop. The loop may have a first portion of concurrent substantially isothermal or constant temperature and increasing applied magnetic field, a second portion of lowering temperature and constant applied magnetic field, a third portion of isothermal and decreasing applied magnetic field, and a fourth portion of increasing temperature and constant applied magnetic field.

U.S. Pat. No. 3,073,974 discloses a method of employing a capacitive element having differences in specific heat capacity between the charged and uncharged conditions over a given temperature range, for converting between thermal and electrical energy, comprising the steps of applying electrical energy to the element at a given voltage within the given temperature range to change the specific heat capacity from an uncharged value to a charged value, subjecting the element to a source of thermal energy to vary the temperature of the clement within the temperature range while maintaining the element in the charged condition; extracting electrical energy from the element at a voltage different from the voltage within the temperature range to change the specific heat capacity of the element from a charged value to an uncharged value; and cooling the element to effect a change in the thermal energy of the element, thereby varying the temperature of the element within the given temperature range while maintaining the element in an uncharged condition.

All of these schemes operate between two reservoirs-source and sink, and as such they are Carnot cycle limited. Low efficiency is a problem in these devices when dealing with low enthalpy reservoirs such as ocean heat. It is an object of the present invention to seek to provide a thermodynamic cycle and method that alleviates this difficulty.

Accordingly, an aspect of the present invention provides an apparatus for performing a thermodynamic cycle comprising: a sample having a ferrormagnetic phase transition temperature; means to magnetise the sample above the ferromagnetic phase transition temperature of the sample; and means to cool the sample to a temperature that is below the ferromagnetic phase transition temperature thereof, wherein the demagnetisation of the sample whilst the sample is below the ferromagnetic phase transition temperature thereof causes the generation of an independent magnetic flux, and wherein the means to magnetise the sample comprises a co-material provided adjacent the sample, the co-material exhibiting a phase transition when a predetermined action is performed thereon, the apparatus further comprising means to perform the action on the co-material.

Advantageously, the means to perform the predetermined action comprises means to apply an electrostatic field to the co-material.

Alternatively, the means to perform the predetermined action comprise means to tension the co-material.

Preferably, the phase transition exhibited by the co-material is a second-order phase transition.

Another aspect of the present invention provides an apparatus for performing a thermodynamic cycle, comprising: a sample that exhibits temporary magnetic remanence; and means to magnetise the sample within a time period that is less than one tenth of the duration of the cycle, the duration of the cycle being less than one ten thousandth of a second, wherein demagnetisation of the sample causes the generation of an independent magnetic flux.

Conveniently, the sample cools during a first portion of the demagnetisation thereof.

Advantageously, the temperature of the sample increases during a second portion of the demagnetisation thereof.

Preferably, the apparatus further comprises means to convert at least some of the independent magnetic flux into an electric current.

Conveniently, the sample is of a first permeability, and wherein a quantity of a material having a second permeability is provided adjacent the sample, the first permeability being lower than the second permeability.

A further aspect of the present invention provides an apparatus for performing a thermodynamic cycle comprising: a sample having a ferroelectric phase transition temperature; means to polarise the orientation of electric dipoles in the sample at a temperature above the ferroelectric phase transition temperature; means to cool the sample to a temperature that is below the ferroelectric phase transition temperature thereof, wherein depolarisation of the sample whilst the sample is below the ferroelectric phase transition temperature thereof during the depolarisation thereof causes the generation of an independent electric flux.

Advantageously, the electrocalorific effect associated with the polarisation of the sample heats the sample during polarisation thereof.

Preferably, the sample is at an initial ambient temperature thereof prior to the polarisation thereof.

Conveniently, the means to cool the sample to a temperature that is below the ferroelectric phase transition temperature thereof comprise, at least partially, a heat exchange between the sample and ambient surroundings thereof.

Advantageously, the sample is heated to the ambient temperature during the depolarisation thereof.

Preferably, the means to cool the sample to a temperature that is below the ferroelectric phase transition temperature thereof comprise, at least partially, an inverse electrocalorific effect associated with part of the depolarisation of the sample.

Another aspect of the present invention provides an apparatus for performing a thermodynamic cycle, comprising: a sample that exhibits temporary electric remanence; and means to polarise the sample within a time period that is less than one tenth of the duration of the cycle, the duration of the cycle being less than one ten thousandth of a second, wherein the depolarisation of the sample causes the generation of an independent electric flux.

Conveniently, the sample cools during a first portion of the depolarisation thereof.

Advantageously, the temperature of the sample increases during a second portion of the depolarisation thereof.

Preferably, the means to polarise the sample comprises a flow of electric current.

Alternatively, the means to polarise the sample comprises at least one rotating permanent magnet.

Conveniently, the apparatus further comprises means to convert at least some of the independent electric flux into an electric current.

Advantageously, the sample is of a first permittivity and a quantity of a material having a second permittivity is provided adjacent the sample, the first permittivity being lower than the second permittivity.

A further aspect of the present invention provides a method of converting energy, comprising the steps of: providing a sample having a ferromagnetic transition temperature; magnetising the sample while the sample is above the ferromagnetic transition temperature thereof; allowing the sample to demagnetise while the sample is below the ferromagnetic transition temperature thereof, the demagnetisation of the sample causing an independent magnetic flux; and converting at least some of the independent magnetic flux into an electric current.

Advantageously, the method further comprises the step of maintaining an ambient temperature in the region of the sample that is higher than the ferromagnetic transition temperature thereof.

Preferably, the method further comprises the step of allowing the sample to cool to the ambient temperature following the magnetisation thereof.

Another aspect of the present invention provides a method of convening energy, comprising the steps of: providing a sample that exhibits temporary magnetic remenance; magnetising the sample, thereby causing the sample to become magnetised in a time period that is less than one tenth of the duration of the cycle, the duration of the cycle being less than one ten thousandth of a second; allowing the sample to demagnetise, the demagnetisation of the sample causing an independent magnetic flux; and converting at least some of the independent magnetic flux into an electric current.

Conveniently, the step of providing a sample comprises the step of providing a ferrofluid.

Advantageously, the step of providing a sample comprises the steps of providing a sample having a first permeability, and further providing a quantity of a material having a second permeability adjacent the sample, the first permeability being higher than the second permeability.

Preferably, at least one rotating permanent magnet magnetises the sample.

Advantageously, a carrier operable to carry a flow of electric current therethrough magnetises the sample.

Conveniently, the step of magnetising the sample comprises the steps of providing a co-material adjacent the sample, which co-material exhibits a further phase transition when a predetermined action is performed thereon, and providing means to perform the action on the co-material.

Advantageously, the step of providing means to perform the action on the co-material comprises providing means to apply an electrostatic field to the co-material.

Alternatively, the step of providing means to perform the action on the co-material comprises providing means to apply tension to the co-material.

Advantageously, the magnetising step and the converting step are carried out by a single means operable to magnetise the sample and to convert at least some of the independent magnetic flux into an electric current.

A further aspect of the present invention provides a method of converting energy, comprising the steps of: providing a sample having a ferroelectric transition temperature; polarising the orientation of electric dipoles in the sample while the sample is above the ferroelectric transition temperature thereof; allowing the sample to depolarise while the sample is below the ferroelectric transition temperature thereof, the depolarisation of the sample causing an independent electric flux; and converting at least some of the independent electric flux into an electric current.

Preferably, the method further comprises the step of maintaining an ambient temperature in the region of the sample that is higher than the ferroelectric transition temperature thereof.

Conveniently, the method further comprises the step of allowing the sample to cool to the ambient temperature following the polarisation thereof.

Another aspect of the present invention provides a method of converting energy, comprising the steps of: providing a sample that exhibits temporary electric remenance; polarising the orientation of electric dipoles in the sample in a time period that is less than one tenth of the duration of the cycle, the duration of the cycle being less than one ten thousandth of a second; allowing the sample to depolarise, the depolarisation of the sample causing an independent electric flux; and converting at least some of the independent electric flux into an electric current.

Advantageously, the step of providing a sample comprises the step of providing a ferro-electric-fluid.

Preferably, the step of providing a sample comprises the steps of providing a sample having a first permittivity, and further providing a quantity of a material having a second permittivity adjacent the sample, the first permittivity being lower than the second permittivity.

Conveniently, at least one rotating permanent magnet polarises the sample.

Alternatively, a carrier operable to carry a flow of electric current therethrough polarises the sample.

Advantageously, the polarising step and the converting step are carried out by a single means operable to polarise the sample and to convert at least some of the independent electric flux into an electric current.

Preferably, the method further comprises the step of providing a circulation system comprising microencapsulated material whose melting point is close to an operational temperature range of the sample.

A further aspect of the present invention provides a method of generating electricity according to any of the above methods.

A further aspect of the present invention provides a method of producing an electric current according to any of the above methods.

A further aspect of the present invention provides a method of refrigeration.

FIG. 8 shows the schematic layout of fourth field generation for use with a device embodying the present invention;

FIG. 9 shows the schematic layout of fifth field generation equipment generation for use with a device embodying the present invention;

Figure 1:
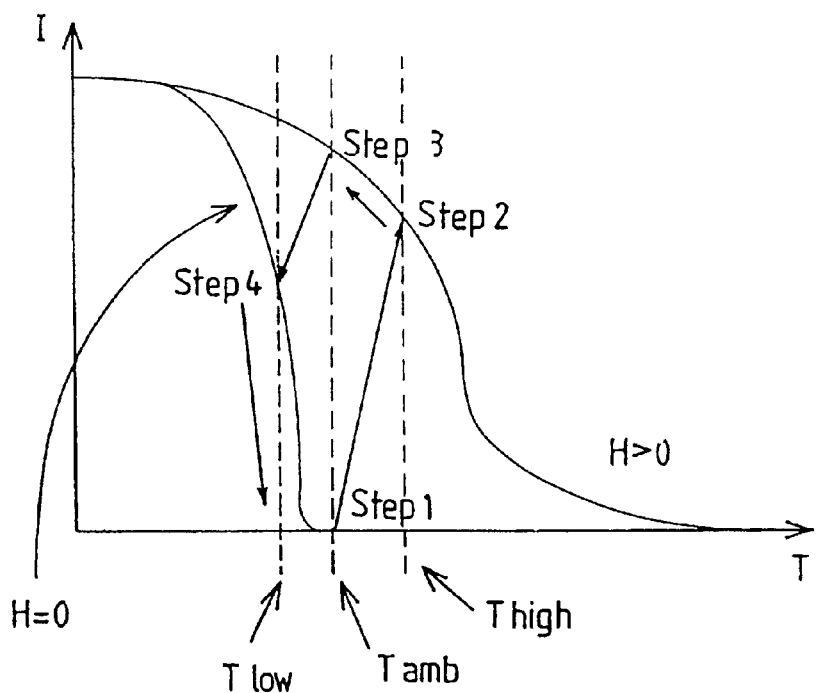
FIG. 1 shows a graph of magnetisation against temperature for a first cycle embodying the present invention.

Turning firstly to FIG. 1 a graph of magnetisation versus temperature for a first cycle embodying the present invention is shown.

The first cycle employs materials with Magneto-calorific properties, that is materials near their ferromagnetic/paramagnetic phase transition points.

Before the commencement of the first cycle, a sample is initially at an ambient temperature, which is above the Ferromagnetic phase transition point (i.e. the Curie temperature) of the first sample.

During a first step of the first cycle, a magnetic field is suddenly applied to the first sample. This causes the first sample to become magnetised, by aligning the magnetic domains within the first sample. As this occurs, the temperature of the first sample rises, due to the magnetocalorific effect associated with the magnetisation, to a temperature that is above the ambient temperature. The magnetocalorific effect occurs due to a localised drop in entropy in the first sample resulting from the alignment, or ordering, of the magnetic domains therein, which is compensated for by an increase in thermal energy, and this effect is described in more detail in Appendix 2.

Once the rate of change of magnetisation of the first sample falls to zero, the thermal energy developed during the first stage of the first cycle is radiated away due to the thermal gradient between the first sample and the surroundings (which are maintained at the ambient temperature), and this cooling comprises a second step of the first cycle. As the first sample cools, the magnetisation thereof rises, following the curve H>0 shown in Figure, which shows the relationship between magnetisation and temperature dictated by the Weiss equation $\mu=B_s(h+\alpha\mu)$ in the presence of the magnetic field applied to the first sample.

Once the sample has cooled to the ambient temperature, the first sample ceases cooling and the system reaches a steady state. At this point, a third step of the first cycle is commenced by the sudden switching off of the applied magnetic field. This causes the magnetisation of the first sample to fall. As this occurs, the temperature of the first sample falls, due to the reverse of the magnetocalorific effect described above in relation to the first step of the first cycle. As the magnetic domains within the first sample begin to move out of alignment with one another and become randomly orientated, the order within the first sample decreases, giving rise to an increase in entropy within the first sample. This increase is compensated for by a drop in the thermal energy present in the first sample.

The curve H=0 shown on FIG. 1 describes the relationship between magnetisation and temperature dictated by the Weiss equation (given above) in the absence of an applied magnetic field. The curve H=0 is similar in form to the curve H>0 described above, however the curve H=0 is shifted to the left on the temperature axis of FIG. 1 with respect to the H>0 curve. As the magnetisation and temperature co-ordinates of the first sample reach the curve H=0, the magnetisation and temperature co-ordinates of the first sample will being to follow the curve H=0, and this marks the end of the third step in the first cycle. The decrease of thermal energy during the third step cools the first sample to a temperature that is below the Curie temperature of the first sample. As the first sample falls below the Curie temperature thereof, it becomes magnetised.

A fourth step of the first cycle comprises the demagnetisation and heating of the first sample in accordance with the zero-field Weiss law, and at the end of the fourth step the first sample has the same magnetisation and temperature coordinates as it did before the commencement of the first step, i.e. having zero magnetisation and being at the ambient temperature. The demagnetisation of the first sample during the fourth step gives rise to an independent magnetic flux.

The necessary condition for an independent flux is that no external field is needed to sustain it. Appendix 1 contains a proof showing that a dependent flux will always lead to zero net electrical work in a cycle. Appendix 1 also contains a proof showing that an independent flux can appear to be dependent if the slew-rate of the external field is low.

Equation A2.7 in appendix 2 can be remodelled to add the new energy term developed in appendix 3 from equation A3.1. However, specific quantities must be considered so dipole moment is re-cast as the dipole moment per unit volume, I, which is also equal to the solenoidal current density multiplied by the cross-sectional area.

Thus, from A3.3

$$I = BA\varepsilon_0 c^2 \quad \text{and} \quad BA = \frac{I}{\varepsilon_0 c^2}$$

The expression BA is substituted into A3.2 for $\phi$ and then into A3.1 leading to:

$$\Delta U = \frac{n}{\varepsilon_0^2 c^4} \frac{k}{R} I dI$$

This is then substituted into equation A2.7 leading to:

$$dU = TdS + HdI + \frac{n}{\varepsilon_0^2 c^4} \frac{k}{R} I dI$$

Routine manipulation as in appendix 2 in equations A2.7, leads to:

$$(\Delta T)_s = -\frac{T}{c_H + \frac{n}{\varepsilon_0^2 c^4} \frac{k}{R} T \left(\frac{\partial I}{\partial T}\right)_H^2} \left(\frac{\partial I}{\partial T}\right)_H \Delta H$$

Thus, a 'virtual heat capacity' exists on step 4 of the first cycle due to the extra term in the denominator summing with $C_H$; the dipoles find it harder to randomise in the solenoid field around them. Considering the net electrical work in an adiabatic cycle:

$$\oint H dI = \int_0^{I_M} H dI + \int_{I_M}^0 H dI = 0$$

However in the second integral of the thermodynamic cycle, the symmetry is broken:

$$\int_0^{I_M} H dI + \int_{I_M}^0 H' dI < 0$$

For the same $\Delta T$ as the adiabatic case, the heat capacity has been altered with the 'virtual heat capacity'. Thus $\Delta H$ is not the same, as it must be higher to maintain the equality since the heat capacity has gone up. This is denoted in the second integral with H'. It is as though two half-adiabatic cycles have been pasted together: the first integral is energy input on the first half of the adiabatic magneto-calorific cycle, the second integral represents the second half of the cycle coming from a much higher magnetisation of a sample with a much higher heat capacity. This can be reasoned because at the fourth step of the first cycle, the magneto-calorific effect does not have to 'know' or 'remember' that in the previous step it was allowed to cool isothermally to ambient. The thermodynamic equations keep no 'history' of the changes they have undergone. What is important are the exact differentials, the thermodynamic co-ordinates of the thermodynamic identity A2.7, at the start and end of a cycle i.e.

if $dU(T,H)=\delta Q+\delta W$ and $\int dU=0$ then if $\delta W<0 \rightarrow \delta Q>0$ The first sample returns to its initial co-ordinates and therefore has the same internal energy. However, the first sample did work so must have absorbed heat.

Figure 3:
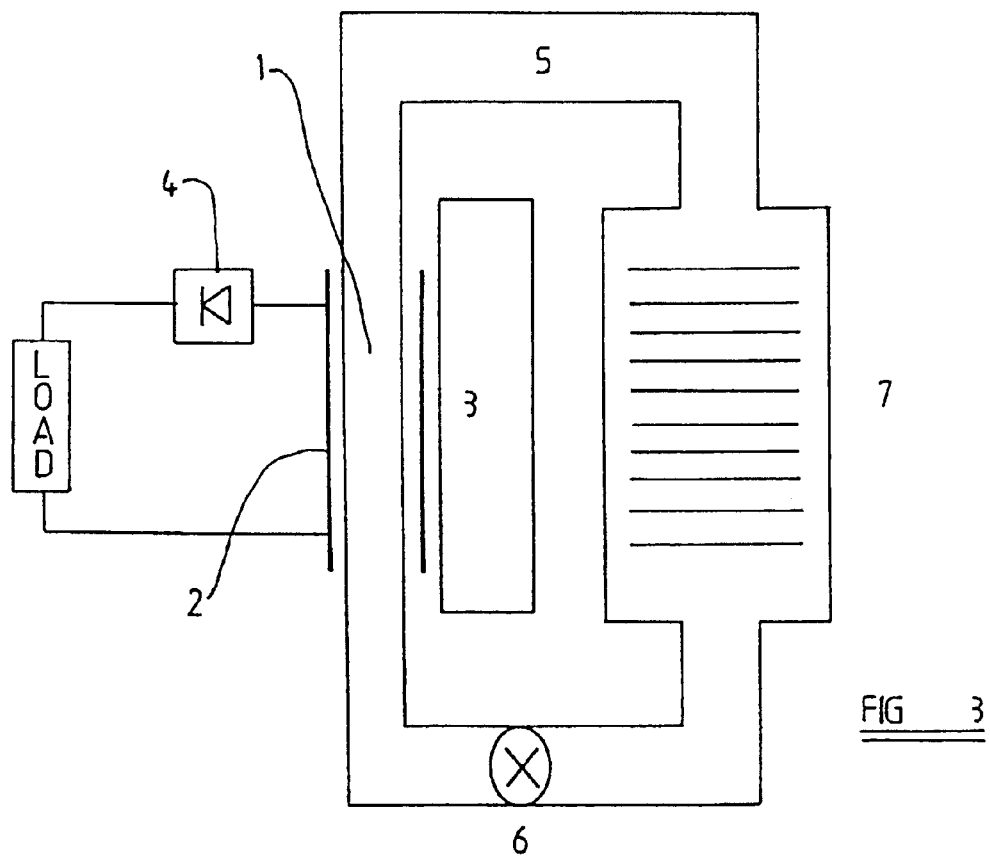
FIG. 3 shows the schematic layout of a device embodying the present invention.

FIG. 3 shows the essential arrangement of a sample 1, the power coils 2, the field generation equipment 3, rectifier 4, circulation system and heat transfer fluid 5, pump 6 and heat exchanger 7. The sample 1 does not have to be localised under the power coils and can travel with the heat exchanger fluid in some embodiments of the invention, however power is converted under the power coils 2 and field generation equipment 3.

Figure 4:
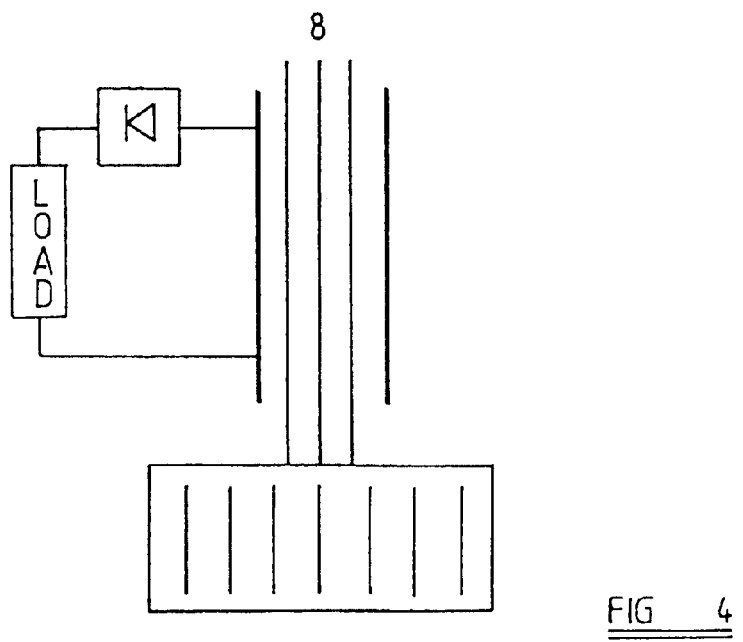
FIG. 4 shows the schematic layout of another device embodying the present invention.

FIG. 4 shows the circulation system replaced by heat pipes 8 in intimate contact with the sample. The power generation coils 2 can dual as the field generation equipment 3 (or exciter coils) by appropriate electrical circuitry. The field generation equipment includes the possibility of non-electrical field generation by rotating magnets.

The exciter/power coil 2 or field generation equipment 3 surrounding the sample 1 is manipulated in a manner shown by the first cycle to form an independent flux in the sample 1. The first cycle is traversed many times per second. Upon warming this independent flux collapses and power is delivered to the power coils 2, rectifier 4 and load. Heat energy is continually supplied by the circulation system 5, 6, 7 or 8 to the sample. The device thus cools its surrounds.

The electrical loses and gains of the first cycle are modelled here and it is shown that this increases with frequency of operation of the cycle. The resistive losses, loss from not fully recovering the field energy of the exciter stages (steps 1, 2 and 3 of the first cycle) and the power developed by the cycle are calculated.

For simplicity it is assumed that the current is constant. This will, in any event, tend to overestimate the power loss. The power $P_{1^2R}$ lost during the exciter phase is multiplied by 'D' (the duty cycle of the on-off period of the square wave). This is frequency independent. Thus:

$$P_{1^2R} = -DI^2 R_{coil}$$

Let $B_E$ be the field applied to the core. The energy in the field is $\frac{1}{2}B_E^2 V$ where V is the volume of the core. If the back emf is recovered on field collapse, some of this energy can be recovered. Let $\xi$ be the fraction of this energy wasted. If the cycle is repeated F times per second:

$$P_{field} = -\xi \varepsilon_0 C^2 B_E^2 F V$$

From appendix 3, the power delivered into a resistance R by the cycle is given by:

$$\text{Minimum Power} = \frac{n^2 k}{R} V^2 B^2 F^2 \qquad \text{Eqn. A3.6}$$

It will be realised that R is the summation of $R_{coil}+R_{load}$. By considering two resistors in series and using elementary circuit theory, the power dissipated in the resistors as a fraction of the total power dissipated is $R_x/(R_1+R_2)$ where $R_x$ is resistor 1 or 2. $B_M$ is the field from the core after the exciter steps. Hence $$P_{loss} = -kn^2 V^2 B_M^2 F^2 \frac{R_{coil}}{(R_{coil}+R_{load})^2}$$

$$P_{gain} = +kn^2 V^2 B_M^2 F^2 \frac{R_{load}}{(R_{coil}+R_{load})^2}$$

The total power is the sum of $P_{1^2R}+P_{field}+P_{loss}+P_{gain}$. If this is positive there is a net generation of power. It will be noted that the minimum power generated is squared in F against the field loses which are linear. It is simply a matter of engineering to make $R_{coil}$ much less than $R_{load}$.

Figure 2:
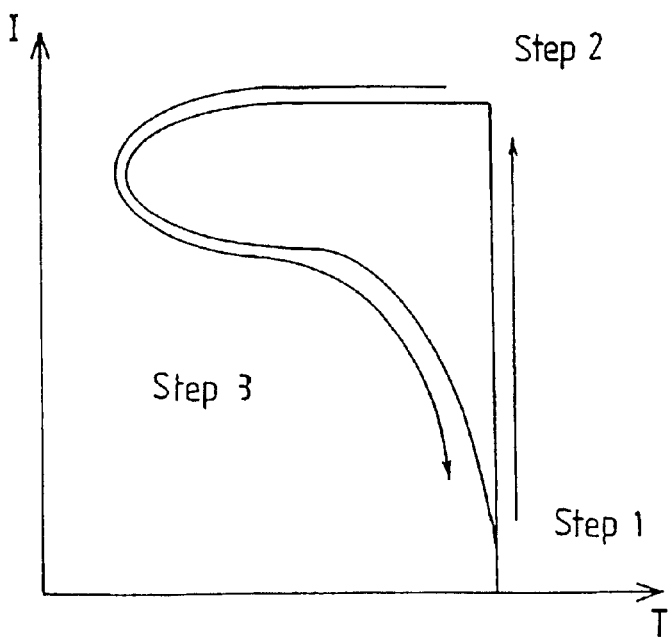
FIG. 2 shows a graph of magnetisation against temperature for a second cycle embodying the present invention.

FIG. 2 shows a graph of magnetisation against temperature for a second cycle embodying the present invention. Before the commencement of a first stage of the second cycle a second sample has zero net magnetisation, and is at an initial ambient temperature. The second sample is formed from a material having the property of temporarily retaining magnetic remanence after the application to and subsequent removal of a magnetic field from the material, for instance a ferrofluid.

The first step of the second cycle is commenced by the sudden application of a magnetic field to the second sample. This causes the magnetisation of the second sample to increase. In contrast to the first step of the first cycle, there is very little corresponding rise in temperature as the second sample becomes magnetised, as the initial temperature is far from the ferromagnetic phase transition point of the second sample.

The first step of the second cycle is brought to an end by the abrupt removal of the applied magnetic field from the second sample, this event being a second step of the second cycle.

A third step of the second cycle is commenced immediately after the removal of the magnetic field from the second sample. During a first portion of the third step, the temperature of the second sample begins to fall, as thermal energy within the second sample is expended in working to re-randomise the magnetic domains in the second sample against the magnetic field arising from the remnant magnetism therein.

The fall in temperature of the second sample during the third step thereof is initially greatest when the magnetisation is at its highest, at the beginning of the first portion of the third step. This fall in temperature is accompanied by a drop in the magnetisation of the second sample, as the magnetic domains therein become increasingly non-aligned with respect to one another.

After a short time, heat from the surrounds warms the sample, and a second portion of the third step begins. At the same time, the magnetic domains within the second sample become randomly orientated, and this provides an independent magnetic flux as the magnetic field arising from the alignment of the magnetic domains collapses. At the end of the third step, the magnetisation and temperature co-ordinates of the second sample are equal to those before the commencement of the first step of the second cycle. The rise in temperature, coupled with the fall in magnetisation, gives rise to the looped shape of the magnetisation curve for the second sample. For the magnetic flux generated during the second portion of the third step to be appreciable, the first step preferably occurs within the first tenth (or less) of the duration of the second cycle.

Components employed for field generation during the first step of the second cycle and recovery of power from the independent magnetic flux during the third step of the second cycle are the same as those employed for the corresponding tasks in the first cycle, and it will be clear to a skilled person how to put the second cycle into practice.

Listed below are some technical problems that may be encountered in relation to the first and second cycles, along with their solutions:

| Problem | Solution |
|---|---|
| Low permeability of sample 1 implies large exciter field is required hence much energy expenditure on exciter current | Use of high permeability materials 13 in close proximity to a sample 1 |
| Sample 1 has small magnetisation | As above |
| Small temperature differentials | Increase the surface area of sample Use thin films and/or small particles Have circulant 5 or heat pipe 8 in intimate contact with working substance |
| Boost energy gain per cycle | Cycle many thousands of times per second Low resistance wiring Use low voltage drop diodes e.g. Schottky or back-diodes High flux linkage e.g. toroid shape Low loss high permeability materials Minimise eddy current losses by thin sections |
| Large energy expenditure in exciter field | Recoup exciter field energy by 'flyback convertor' circuit Heat sink current source driving exciter coil 2 to heat exchanger 7 or Tuned LC circuit |
| Device has large inductance we cannot switch rapidly by voltage source or allow exciter field to collapse rapidly | Use a step up transformer driving exciter coil Lower inductance of exciter/power coil 2 in power delivery phase of cycles by use of a lower autotransformer tap or Shunt a large inductance into the exciter coil or Switch exciter field with current source |
| Respond only to differential changes in magnetisation in first cycle (FIG. 1) not absolute else the high permeability material will saturate. (Device will have a temperature drop across it) | Use heat pipe 8 to ensure that temperature is same form one end of device to the other or Use field cancellation circuit and/or Use high perm. material with 'deadband' |
| Ferrofluid relaxation time too fast | Increase core size or Increase hydrodynamic radius or Increase viscosity of carrier fluid |

The problems will be broken down into sub-systems via examples that can overall be integrated into one device;

Field generation, Exciter/Power output subsystem

Field Cancellation Circuit

Heat exchange/circulation system

Materials and Field boosting by high permeability materials

Viscosity modification of ferrofluid

A Heat Battery

Non-magnetic field exciter scheme

Ferro-electret and Ferro-electric-fluid schemes

Field Generation, Exciter/Power Output Subsystem

Figure 5:
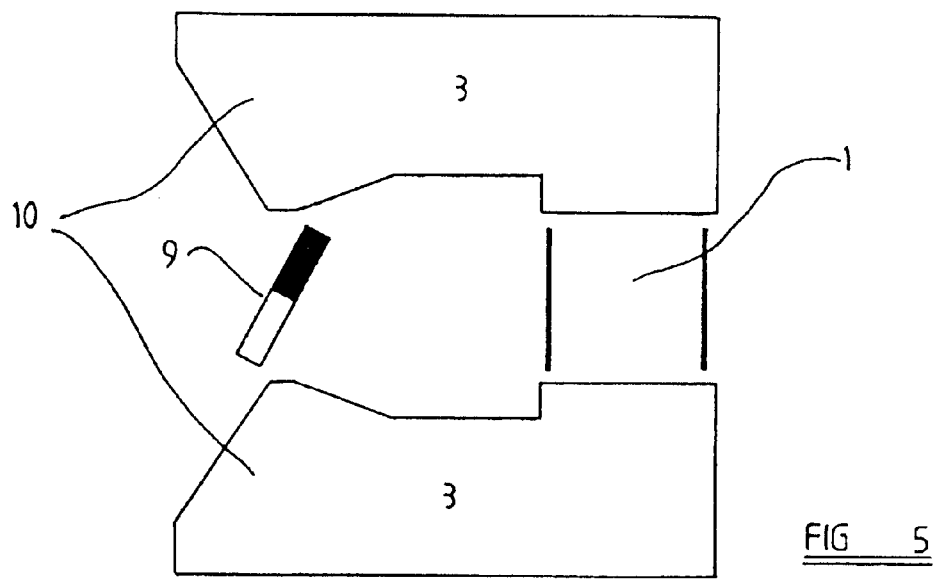
FIG. 5 shows the schematic layout of first field generation equipment for use with a device embodying the present invention.

Turning to FIG. 3, the field generation equipment 3 can be electrical or mechanical. Possible mechanical schemes are a rotating magnet in a stator arrangement (as shown in FIG. 5). When the magnet 9 is aligned with the poles 10 maximum flux is transmitted to a sample 1. As shown in appendix 1 this flux must have a relatively sharp rise and fall time compared to the period. This is achieved by sharp pole design.

Figure 6:
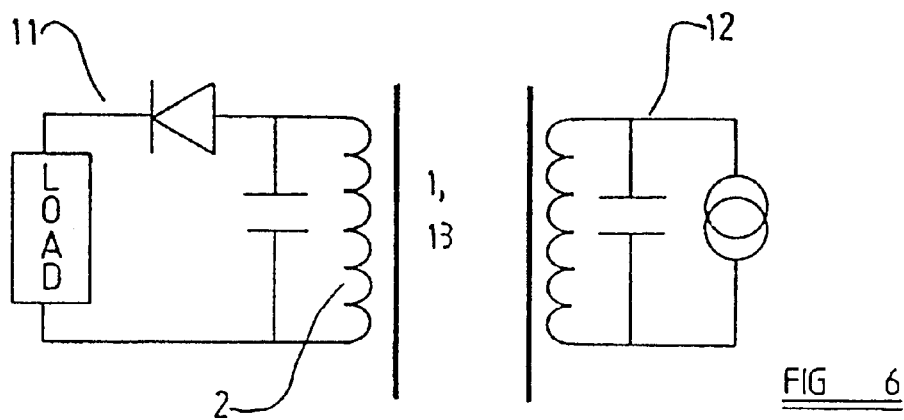
FIG. 6 shows the schematic layout of second field generation equipment for use with a device embodying the present invention.
Figure 7:
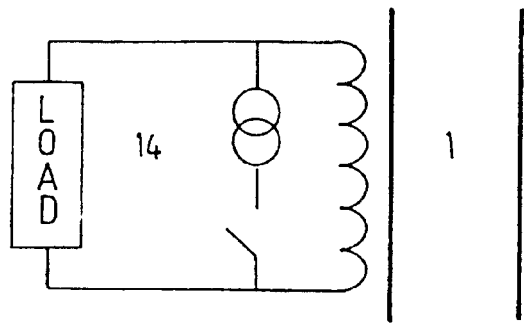
FIG. 7 shows the schematic layout of third field generation equipment for use with a device embodying the present invention.

FIGS. 6 and 7 show the essential schematics of electrical field generation by tuned circuit (as shown in FIG. 6) and current source (as shown in FIG. 7). The field generation equipment 3 (as shown in FIG. 3) becomes combined with the power generation coils 2.

The circuit 11 shown in FIG. 6 generates a largely sinusoidal field and on independent magnetic flux collapse power is delivered to the load. To achieve the sharp rise and fall times of the exciter field high permeability materials 13 are used in proximity to the sample 1.

Circuit 12 (shown in FIG. 6) is a field cancellation circuit that ensures that the field exposed to the working substance varies between zero and a net positive flux. The circuit shown in FIG. 7 achieves the sharp rise and falls times by driving the essentially high inductance of the device with a current source 14. To recoup dissipation losses in the current source, it should be connected to the heat exchanger 7.

FIG. 8 shows a brute force approach to establishing the exciter field. A sub-circuit 15 consists of a very large capacitance connected to the lower turns of the power/field generation coil 2,3 in a low resistance circuit. The inductance is low, allowing the current and hence field to be rapidly established. A higher tap via a diode returns both the field energy and power from independent flux collapse to the capacitor and load.

FIG. 9 shows a more elegant scheme of generating the exciter field by use of lower currents. More turns are wound so the inductance increases, but a step up transformer is used to lower the inductance as seen by the primary by $L/n^2$. It is ensured that on field collapse a low time constant is in effect by tapping the exciter/power generation coil with only a few turns via switch A (B open) for the dependent part of the field and then using switch B (A open) for the independent flux. It is possible to use a separate coil for this that is essentially a cylindrical sheet wrapped around the device several times to get good flux linkage and induced voltage. The diodes are low dropout types such as Schottky, back-diode or field-effect-transistors with appropriate switching to ensure rectifying action.

It is possible to wind a high frequency step up transformer with efficiency greater than 99% with careful design. The more field energy recouped, the more compact the device can be. This is a balance between the $P_{field}$ term and the minimum power expression in the theory section here in on the power developed. Typical frequencies of operation are 10–500 KHz. The higher limit is set by switching electronics and typical volumes for the device are in excess of 10 liters. The large inductance of the device (in the order of Henries) can be reduced by a multi-stage transformer to be in the order of micro-henries and so allow rapid switching via a voltage source. For instance a three-stage 1:1000 transformer made from 1:10 will transform the impedance down by $10^6$. Careful design by use of ferrite core in toroidal form (high flux linkage), low flux density in the core, low wire losses and spaced/nested low capacitance windings whereby windings are distanced from one another by spacers enables this transformer to be constructed.

Figure 10:
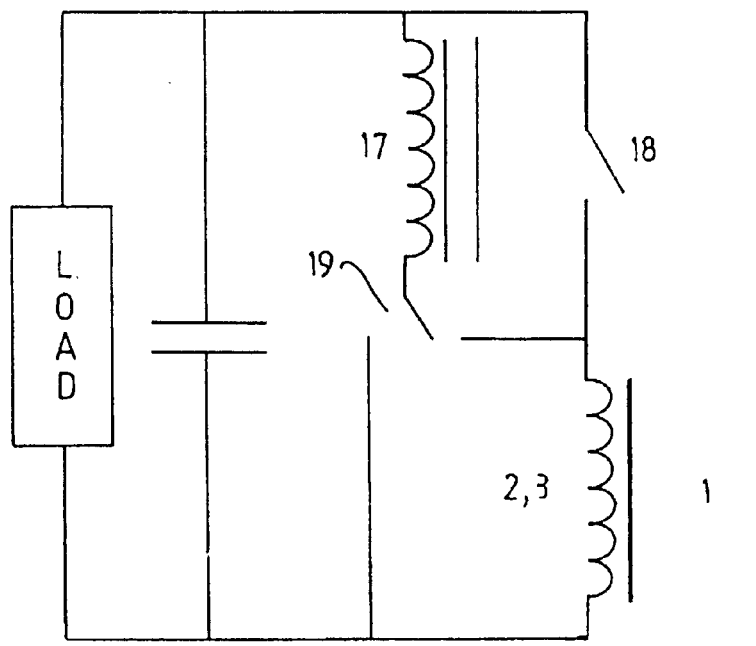
FIG. 10 shows the schematic layout of sixth field generation equipment for use with a device embodying the present invention.

Another scheme (shown in FIG. 10) to generate a rapidly changing exciter field is to switch 19 (switch 18 open) current already established in a larger inductor 17 (19 to the left) into the smaller inductance of the field coil 2,3 (19 to the right). The large inductance should have good high frequency performance and the method discussed earlier for the transformer applies. When the independent flux collapses switch 18 is closed and 19 is to the left, field energy and independent flux work are delivered to the rest of the circuit.

The switching to low inductance of the exciter/power generation coil 2,3 on field collapse to lower the time constant is used in all the manifestations of field generation circuitry if not explicitly shown.

Field Cancellation Circuit

Figure 11:
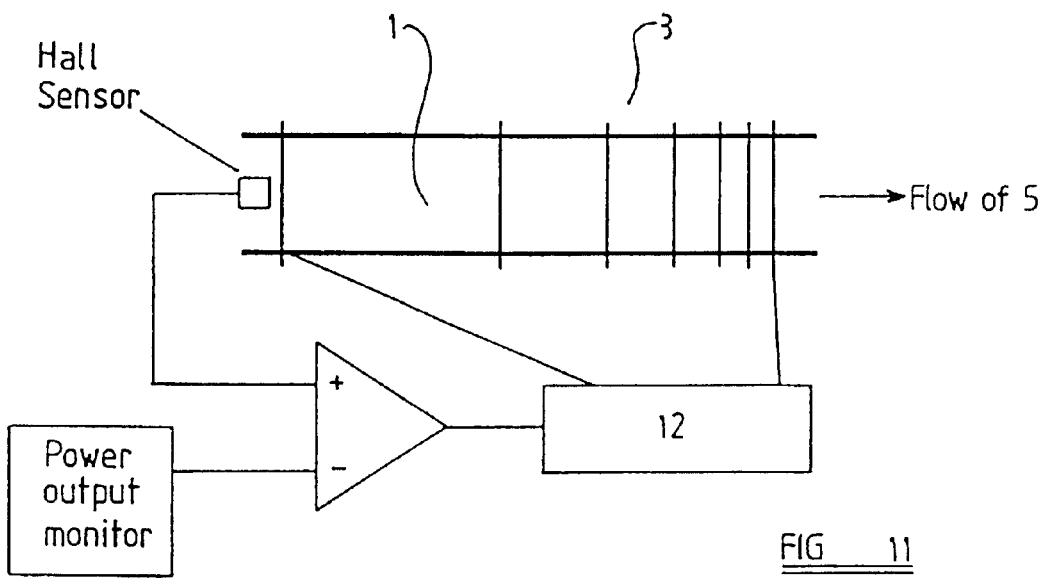
FIG. 11 shows the schematic layout of a field cancellation circuit for use with a device embodying the present invention.

Turning to FIG. 11, this procedure is applicable to the first cycle. As will be appreciated, when high permeability materials are use to boost the field from the working substance, the cycle really responds to the change in magnetisation in the fourth step on the first cycle, not the absolute magnetisation. FIG. 1 shows a return to the first step at or above the Curie temperature of the sample 1. To allow operation below the Curie temperature and hence a wider temperature range we must not allow this 'base remenance' to saturate the high permeability material. Also, the device will have a temperature differential across it with the working substance at different magnetisation from end to end. A solution to this is to lower this temperature differential by use of a heat pipe 8 (as shown in FIG. 4) which has extremely high conductivity.

A small weak field counter to the base remenance provides a 'zero level' for the high permeability material. There are two methods of providing this field: reuse the field/power coils 2,3 and add a biasing current circuit 12 to it; or wind an additional coil.

There are two methods of generating the control signal to the field cancellation gear: measure the field with a Hall sensor or detect power output, and boost the counter field when this falls. Both signals are low pass filtered. FIG. 11 shows the general scheme, the sensors being put into a tight negative feedback loop with the field cancellation gear. FIG. 11 also shows the possibility of winding a cancellation coil 14 that has a progressive increase in the field strength in the flow sense of heat transfer fluid 5 through the device. This allows for a temperature differential across the device where there is a higher base magnetisation on the flow output side (cold side) compared to the flow input side (warmer side).

Heat Exchange/circulation System

FIGS. 3 and 4 show the circulation fluid 5 bathing or heat pipes 8 in intimate contact with a sample 1. The fluid 5 is inert and has good heat capacity and transfer characteristics. An example of such a fluid is low fraction 200/1cS polydimethylsiloxane silicone fluid produced by Dow Corning, should the working substance be reactive to water. If the sample in not localised under the coils it can be suspended in the fluid. The next section covers this (as one approach) and also ferrofluid is a manifestation of the working substance integral with the fluid 5.

To ensure rapid heat flow one must make the working substance have a large surface area and this concern is addressed below. The fluid 5 can assist rapid flow of heat to the sample 1 by having local heat sources. One can micro-encapsulate a material at its melting point near to the operating point of the working substance so that there are localised heat reservoirs. Fats and medium weight alkanes can be encapsulated by common methods.

Another method of permitting high heat flow is to use heat pipes which have conductivities over a thousands times greater than copper. A fine heat pipe with high surface area in intimate contact with the working substance can be arranged as part of the high permeability field boosting materials and this is covered in the next section. The high permeability materials can be cast into fine pipes, their internals being the heat pipe and the external surface in contact with the working substance. If the operation temperature of the device is kept lower than the ambient temperature then heat exchanger design is less demanding.

Materials and Field Boosting by High Permeability Materials

Suitable materials with high magnetic entropy and suitable temperature ranges for the first cycle are Gadolinium (Curie point 16° C.), Copper-Nickel alloys (20–50° C., 28–34% Cu respectively, typically 1–2% Fe) or materials whose Curie points are higher or lower depending if the application is extreme. A skilled person will be aware of many suitable materials. Such materials are formed to have a high anisotropy by aligning the easy axis of magnetisation (by drawing) or high shape anisotropy. Materials suitable for the second cycle are iron, cobalt or ferrite based ferrofluids. The higher the particle anisotropy the greater the induction the ferrofluid will sustain. Cobalt and ferrite ferrofluids therefore give high inductions. Changing the shape of the ferrofluid particles to increase shape anisotropy also helps.

The high permeability material fulfils two functions, of concentrating the exciter field and boosting the magnetisation from the working substance (especially the first cycle). In the former case, the more flux concentrated will means less flux wasted in space not near the sample. Ultimately we want to recover field energy to have a compact device and there is no point wasting exciter field around non-sample material that will never yield energy. In the latter case the boosting is limited by the anisotropy constant of the sample. The field energy of the high permeability material should not exceed the equivalent 'anisotropy field energy' of the sample or it will break up into domains to reduce the magneto-static energy. Typical anisotropy fields are of the order of tens of kA/m limiting the volume of the high permeability to about ten times the volume of the working substance. The anisotropy field can be enhanced by the 'shape anisotropy field' and by making the working substance long and slender. However the equivalent dipole representation of this long material has the dipoles far apart thus fringing fields into the high permeability material will be low, we must then use an even higher permeability material. The relevant design criterion are shown below:

Typical crystalline ($k_1$) anisotropies/(kA/m): Gd 50, CuNi alloy 30, Cobalt 60 (ferrofluid)

Figure 23:
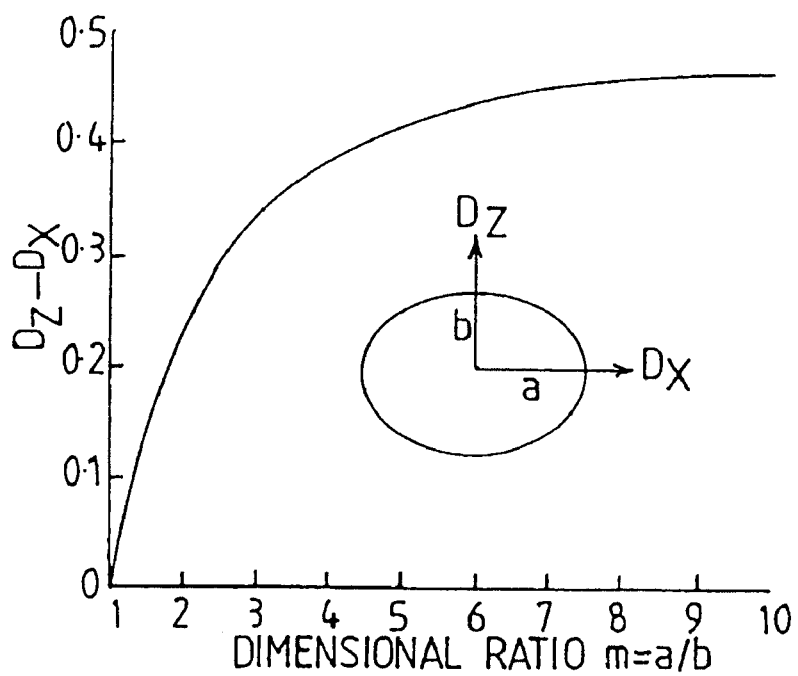
FIG. 23 shows a graph of shape anisotropy in a prolate ellipsoid of rotation.

The shape anisotropy field $H_c$ is given by:

$$H_c = (D_z - D_x) M_s$$

where $M_s$ is the saturation magnetisation and the demagnetisation factors are shown in FIG. 23. FIG. 23 shows the shape anisotropy in a prolate ellipsoid of revolution showing variation of the difference in the two principal demagnetising factors $D_z - D_x$ as a function of the axial ratio a/b.

Shape anisotropy is seen to be of little use in the first cycle where magneto-calorific materials are used because the magnetisation is so low anyway, the $k_1$ anisotropy is primarily relied upon. This is not of concern with ferrofluids where large magnetisation is generated.

In the following dipole equations:

$$B_r = \frac{\mu_0}{4\pi} \frac{2 p_m}{r^3} \cos\theta$$

$$B_\theta = \frac{\mu_0}{4\pi} \frac{p_m}{r^3} \sin\theta$$

$$p_m = ml$$

the angular and radial parts of the field are shown. The magnetic dipole moment is a product of the pole strength and their distance apart.

FIGS. 12–17 showing various arrangements of high permeability material 13 with the sample 1. The material 13 is of small cross-section so as to have low eddy current losses. Suitable materials include iron, nickel, mu-metal, ferrites, vitrovac (Seimens corporation). Various configurations are described below.

Figure 12:
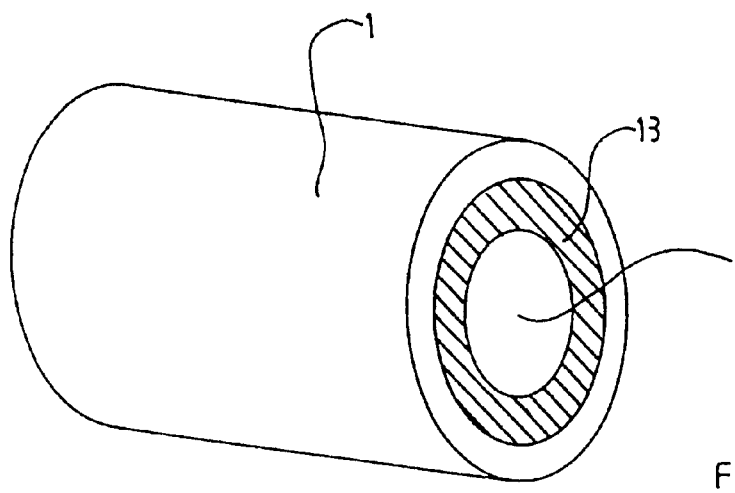
FIG. 12 shows a first arrangement of high permeability material with a sample for use with a device embodying the present invention.

FIG. 12 shows an arrangement of small pipes that can dual as heat pipes. One can use electrode-less deposition to deposit iron or nickel onto nylon wire. The wire can be heated to burn off the nylon leaving a high permeability pipe 13. For materials suitable for use with the first cycle, a further deposition of the working substance 1 can be done by further electrode-less deposition, electroplating, vapour deposition, spraying or electrostatic deposition followed by a binding process.

Figure 13:
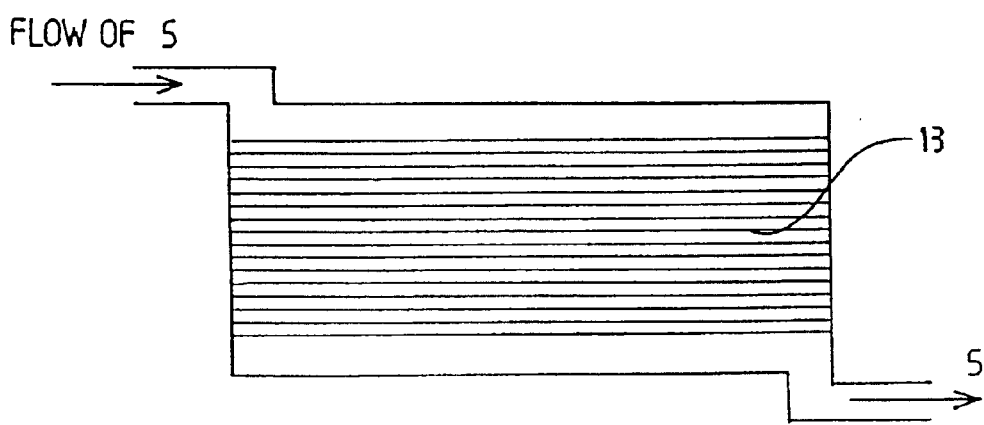
FIG. 13 shows a second arrangement of high permeability material with a sample for use with a device embodying the present invention.

FIG. 13 shows an arrangement of the high permeability material as a loose wire 'wool' matrix or loom that has body and support and can have the working substance (for the first cycle, ferrofluid will flow into its structure) deposited by the deposition methods just stated. The heat transfer fluid 5 (as shown in FIG. 3) can pass easily through the structure. The wire loom form is amenable in preparation by cladding iron or nickel rods with the working substance (if ductile, Cu—Ni, Gd) and then stretching.

Figure 14:
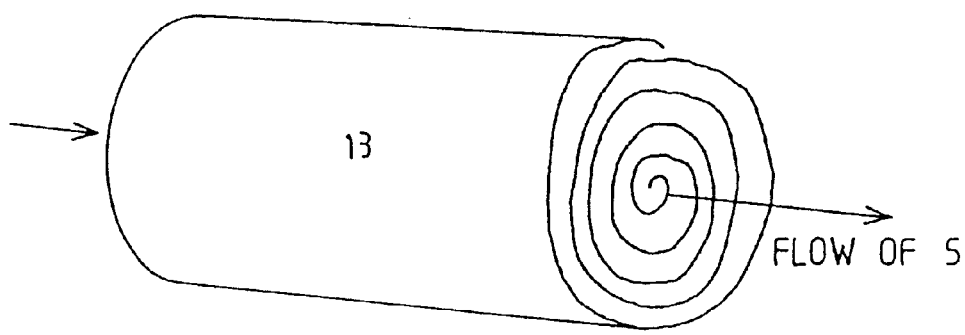
FIG. 14 shows a third arrangement of high permeability material with a sample for use with a device embodying the present invention.

FIG. 14 shows an arrangement of the high permeability material as a loose spiral. This configuration is amenable to having the working substance hot pressed onto it.

Figure 15:
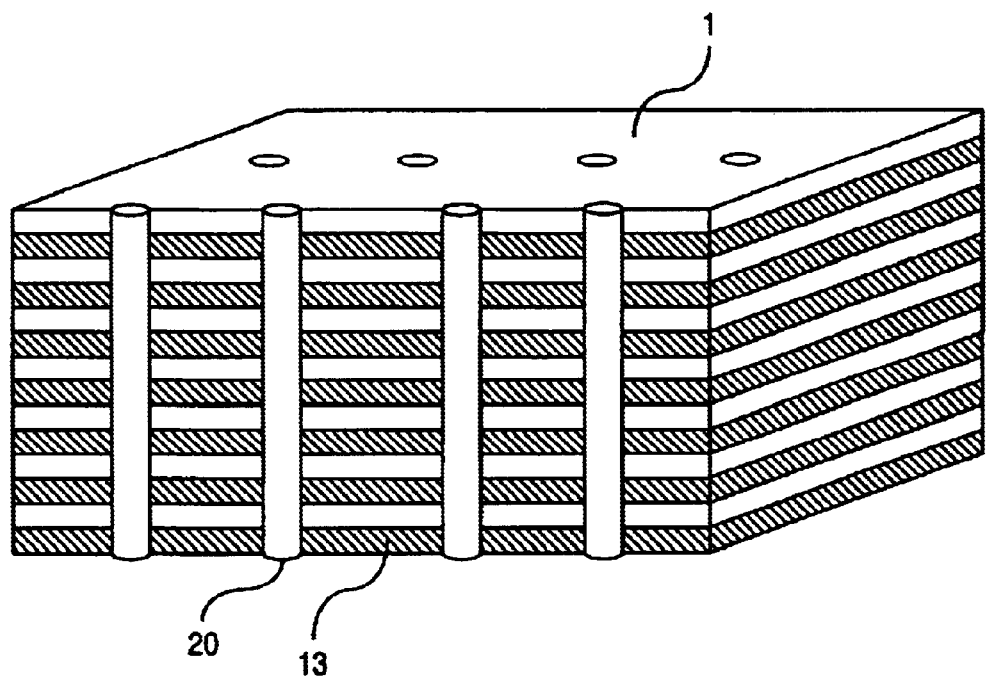
FIG. 15 shows a fourth arrangement of high permeability material with a sample for use with a device embodying the present invention.

FIG. 15 shows an alternating sandwich structure of the high permeability material with holes 20 therethrough to permit flow of heat transfer fluid 5 or heat pipes 8 (as shown in FIGS. 3 and 4).

Figure 16:
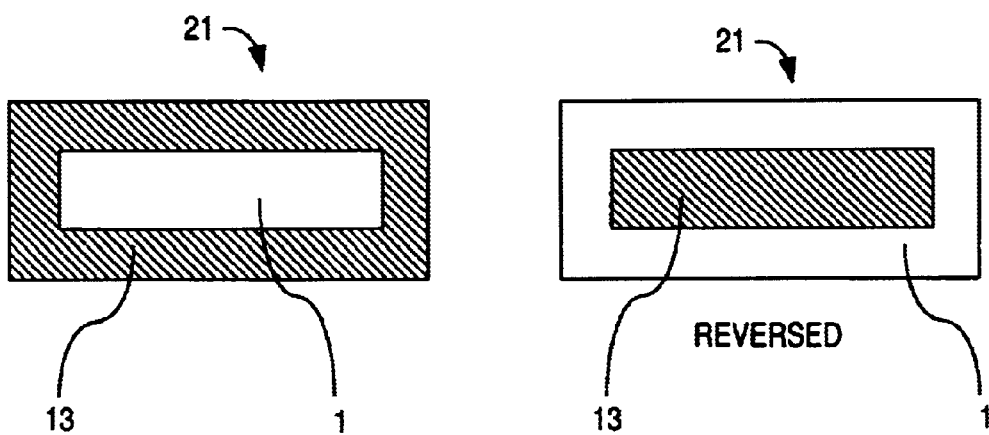
FIG. 16 shows a fifth arrangement of high permeability material with a sample for use with a device embodying the present invention.

FIG. 16 shows an arrangement as long, slender entities 21 that can be high permeability material 13 on working substance 1 or 1 on 13. For the second cycle we just have the material 13. These entities will align themselves with the flow of heat transfer fluid 5 when dispersed and can thus be made to generate the greatest field in the intended direction. Occasional long bursts of the exciter field also help to align the entities. Methods of manufacture include electrode-less deposition, electroplating, vapour deposition onto wire, cladding and stretching onto wire, spraying or electrostatic deposition, growth then chemical treatment (Ni wire with Cu—Ni alloy around it), and precipitation of pure phase (Ni in Cu—Ni alloy for instance) by heat or other treatment.

Figure 17:
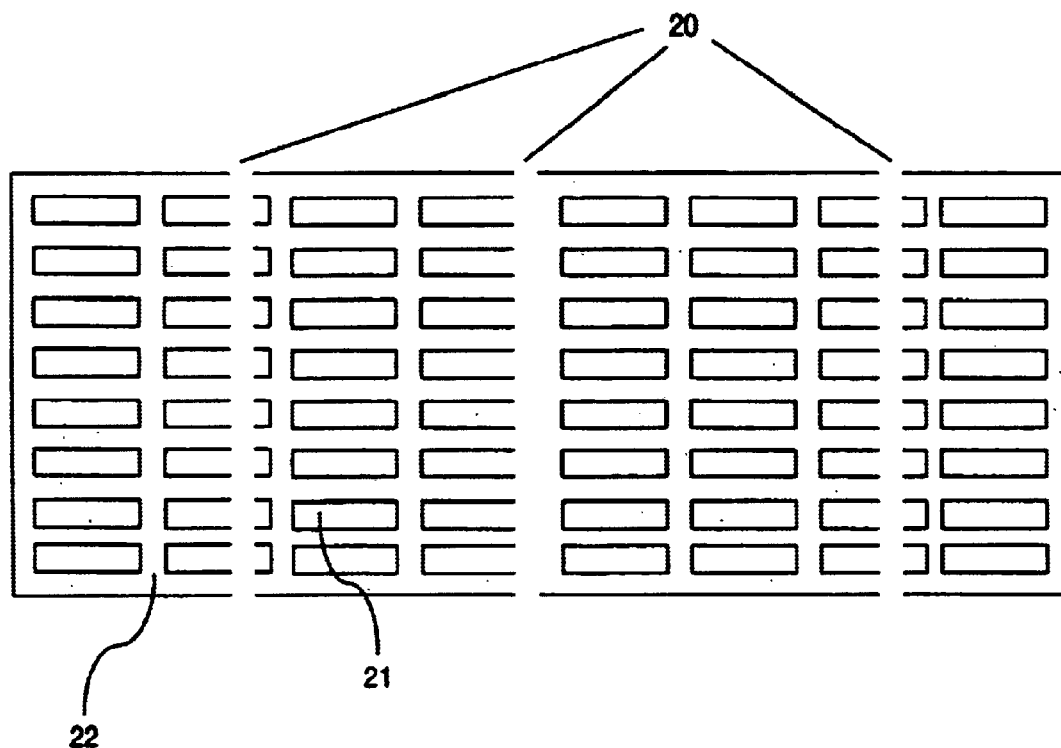
FIG. 17 shows a sixth arrangement of high permeability material with a sample for use with a device embodying the present invention.

FIG. 17 shows an arrangement of the long slender entities 21 of FIG. 16 aligned in a solid block that can be drilled with circulation holes 20 as shown in FIG. 15. Around the entities is grown a non-magnetic and non-electrically conductive material 22 to prevent flux closure and eddy current loss. The material 22 can be grown by the methods discussed herein. The plurality of entities can be compacted or sintered or made to chemically adhere to form the block.

The relaxation time for the independent flux to be destroyed is a characteristic of the ferrofluid (discussed below) but for the first cycle materials the dimensions as governed by the Fourier heat diffusion equation. The time it takes the particles to return to the temperature of their surroundings is modelled by a simple one-dimensional Fourier Law and to obtain the approximate dimensions, the rest is empirically derived.

Thus:

$$mc\Delta\theta = kA \frac{dT}{dx} t_r$$

Where
m is the mass;
C is the specific heat capacity;
$\Delta\theta$ is the temperature difference;
k is the thermal conductivity;
A is the area for heat transfer;
dt/dx is the spatial rate of change of temperature; and
$t_r$ is the time taken for the process.

Let the particle be modelled as a long cylinder of radius r, and length h. The ratio of volume to area is r/2 for h>>r. Let ρ be the density of the material. Thus, $$t_r = \frac{prc\Delta\theta}{2k\frac{dT}{dx}}$$

Substitution of common average figures will give a 'ballpark' figure for $t_r$. A figure of about 10 μs is arrived at for dimensions of order of 10 μm.

Viscosity Modification of Ferrofluid

Ferrofluid is used as a sample in the second cycle. As explained in appendix 1 the induction from the sample must be independent if there is to be a net gain of energy from the device. Electronic switching will be slew-rate limited and with power electronics will have a typical upper limit of 1 MHz. The remenance relaxation time of the ferrofluid must therefore be 10 μs or more. Unmodified ferrofluid has a relaxation time of the order of 100 picoseconds or quicker. This can be achieved by slowing down the response over several orders of magnitude by three methods: increasing the core size, increasing the hydrodynamic radius by changing the size of the surfactant polymer or the addition of viscosity enhancing agents. Processing is then performed to remove most of the spread in relaxation time and keep in a relatively narrow window of the intended relaxation time.

A Heat Battery

With reference to FIGS. 3 and 4 the heat exchanger can be interfaced to a system of high heat capacity and temperature to form a heat battery. This system could be a storage tank or a small furnace offering hybrid operation whereby fuel is burned to generate electricity. Thus, an on 'demand unit' can be made in which the tank 'trickle charges' from a source with a low rate of heat transfer to the device which can, for brief bursts, permit a much greater heat flow.

Non-magnetic Field Exciter Scheme

Figure 18:
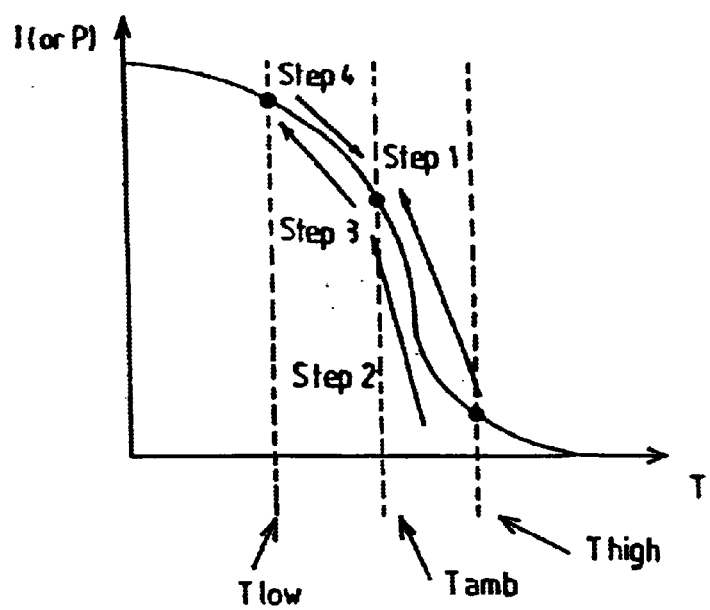
FIG. 18 shows a graph of magnetisation against temperature for a third cycle embodying the present invention.

FIG. 18 shows a third cycle which is a variant on the first cycle, where an electro-static field is used in conjunction with a co-material (being a liquid crystal or similar material) that undergoes a second order phase transition when stressed in some manner. Another example is a long chained polymer material subject to mechanical extension.

The manner of thermal cycling in the third cycle is to apply the stress (field, tension etc.) to the co-material so that it warms by second order phase transition during a first step of the third cycle. The co-material then cools to ambient with the field on, this cooling comprising a second step of the third cycle. The field is then switched off so that the co-material drops below the ambient temperature due to the inverse of the process by which the warming during the second-order phase transition, during a third step of the third cycle.

Finally, the co-material return to its original temperature during a fourth step of the third cycle. In this manner, the co-material cycles the third sample.

During the fourth step of the third cycle, an independent flux is generated which is destroyed on the temperature rising to ambient. All previous methods of arrangement of materials (high surface area, field boosting by high permeability materials, methods of heat transfer and circulation) apply.

Figure 21:
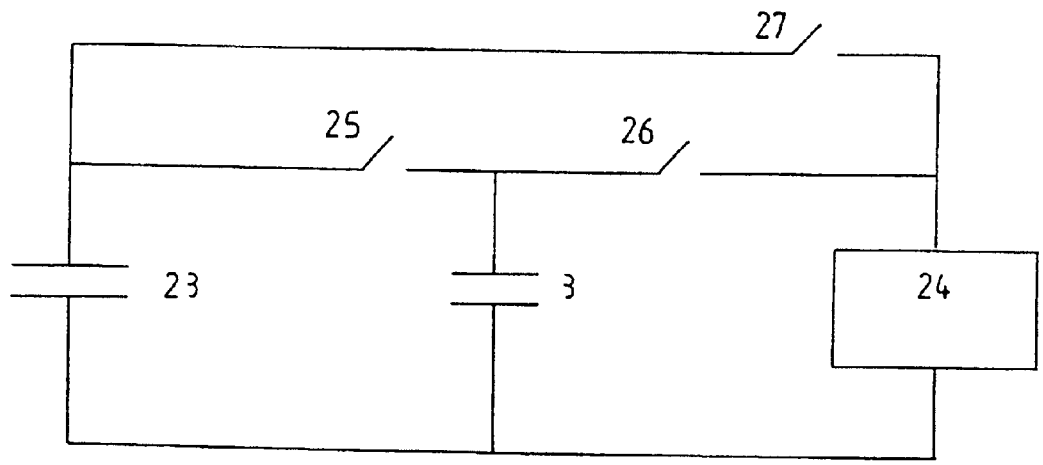
FIG. 21 shows electrostatic field generation equipment for use with a device embodying the present invention.
Figure 22:
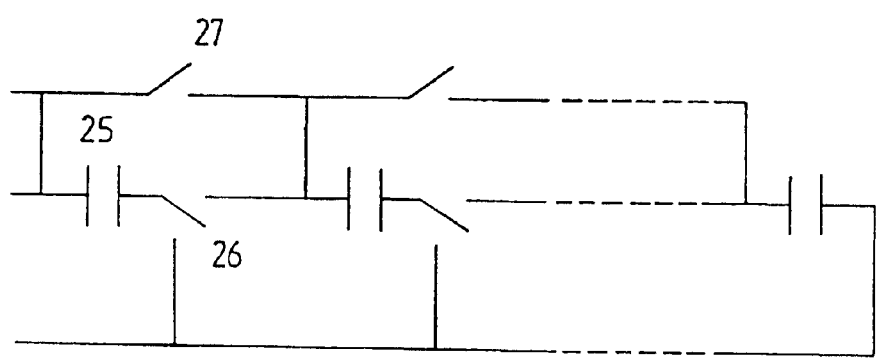
FIG. 22 shows a variation of the electrostatic field generation equipment of FIG. 21.

FIG. 21 shows an arrangement whereby electrostatic field generating equipment (3) (a capacitor with the co-material, working substance and heat exchange fluid 5 or heat pipes 8 between its plates) is cycled. The large capacitor 23 on closing switch 25 (all others open) brings the lesser capacitance of the field generating equipment 3 up to the same voltage. The exciter field is discharged via switch 26 into capacitor network 24. The capacitor network 24 is then discharged via switch 27 back to the large capacitor 23 to restart the cycle. By this method the field energy is recouped. The change in magnetisation of the third sample is picked up by the power coils 2 as seen in FIGS. 3 and 4. FIG. 22 shows the arrangement and means by which the capacitor network 24 is able to return most of its charge to the large capacitor 23. When the field generation equipment 3 is discharged into 24, all of the switches 27 are closed and switches 26 are switched to the chassis so that the capacitors 25 are in parallel. Upon discharge back to the large capacitor 23 switches 27 are opened and switches 26 are switched so that the capacitors 25 are in series. Fields in excess of 10KV/m and frequencies of cycling stated earlier are sufficient to polarise the co-material and ensure operation of the device.

Figure 19:
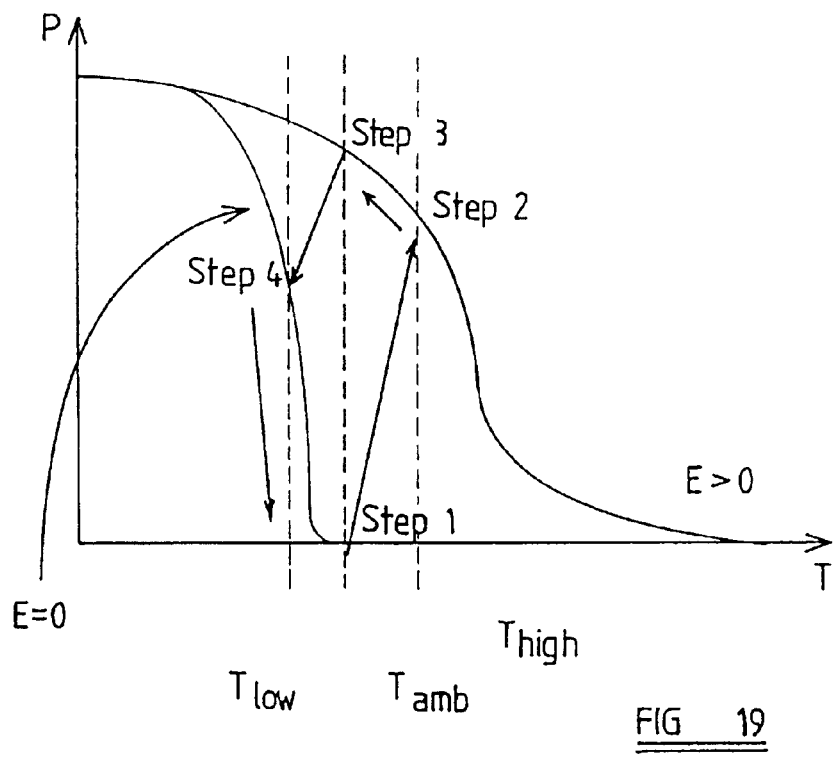
FIG. 19 shows a graph of polarisation against temperature for a fourth cycle embodying the present invention.
Figure 20:
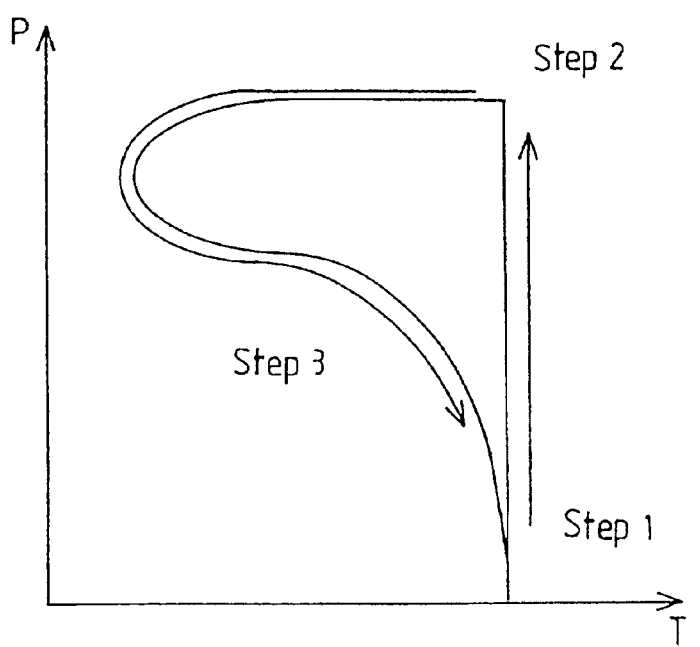
FIG. 20 shows a graph of polarisation against temperature for a fourth cycle embodying the present invention.

Fourth and fifth cycles, shown in FIGS. 19 and 20, are the electrostatic analogues of the first and second cycles. It will be readily appreciated how the polarisation varies with temperature and applied field by analogy with magnetisation in the first and second cycles.

During a first step of the fourth cycle, a fourth sample, which initially has zero net polarisation and is at an ambient temperature (which is above an ferroelectric transition temperature thereof), is polarised by the application of an external electric field thereto. The fourth sample heats up during the first step, due to the electrocalorific effect (analogous to the magnetocalorific effect described herein in more detail), to a temperature above the ambient temperature.

Once the rate of change of polarisation of the fourth sample has fallen to zero, the fourth sample cools to the ambient temperature due to heat exchange with the ambient surroundings thereof This cooling comprises a second step of the fourth cycle. The polarisation of the fourth sample increases as it cools, following the electric equivalent of the 'field-on' Weiss law (denoted by E>1) described above in relation to the first cycle.

Once the fourth sample has reached the ambient temperature, the electric field is switched off, and the fourth sample begins to depolarise, the temperature thereof falling during the depolarisation due to the inverse of the electrocalorific effect. This process comprises a third step of the fourth cycle, and the third step ends when the polarisation and temperature co-ordinates of the fourth sample reach the curve dictated by the electric equivalent of the 'zero field' Weiss law (denoted by E=0). At the end of the third stage, the fourth sample is below the ferroelectric transition temperature thereof.

The fourth sample then depolarises completely, heating up to the ambient temperature as it does so. This complete depolarisation causes an independent electric flux.

Turning to the fifth cycle, which is analogous to the second cycle, a fifth sample, which exhibits temporary electric remenance, is at an initial temperature prior to the commencement of the fifth cycle. A first step of the fifth cycle is commenced by the sudden application of an external electric field to the fifth sample. Once the fifth sample is polarised, which occurs within the first tenth of the total duration of the fifth cycle, the electric field is switched off, which event is the second step of the fifth cycle.

The fifth sample depolarises during third step of the fifth cycle, which is closely analogous to the third step of the second cycle described above. The difference to be borne in mind when considering the fifth sample is that it is electric dipoles within the fifth sample that are aligned and subsequently randomised, rather than magnetic domains.

The changing electric field on the fourth step of the fourth cycle and the third of the fifth cycle causes a changing magnetic field at right angles to the electric field. This changing magnetic field is picked up by power generation coils arranged at right angles to the electric field to deliver power to a load. A suitable material is Barium titanate (BaTiO$_3$). All previous methods of arrangement of materials (high surface area, methods of heat transfer and circulation) apply. The fourth cycle occurs with the ambient temperature maintained just above the ferro-electric phase transition point of a sample employed in the fourth cycle, and it will be clear to a skilled person that an understanding of the operation of the first and second cycles can be applied to the fourth and fifth cycles respectively to develop an understanding thereof In the present specification "comprises" means "includes or consists of" and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

Appendix 1—Proof that a Dependent Flux always leads to Net-Zero Electrical Work in a Cycle Consider an inductor as some circuit element. The net energy for a cycle is given by:

$$\int_T vi \cdot dt = -\int_T \frac{d\phi}{dt} i \cdot dt \qquad \text{Eqn. A1.1}$$

The RHS can be integrated by parts:

$$\int_0^T i(t)\frac{d\phi(t)}{dt} dt = \left[i(t)\phi(t) - \int \phi(t)\frac{di(t)}{dt} dt\right]_0^T = \qquad \text{Eqn. A1.2}$$

$$i(T)\phi(T) - i(0)\phi(0) - F(\phi(T), i(T)) + F(\phi(0), i(0))$$

Since i(0) i(T) and φ(0)=φ(T) the first two terms cancel. Let:

$$i(t)=g(\phi(t)) \qquad \text{Eqn. A1.3}$$

i.e. a dependent flux, the second integral of equation A2.2 can be integrated by parts again after the application of the chain rule:

$$\int \phi(t) \frac{di(t)}{dt} dt = \int \phi(t) \frac{dg(\phi(t))}{d\phi(t)} \frac{d\phi(t)}{dt} dt \qquad \text{Eqn. A1.4}$$

Thus, $$\int_0^T \phi(t) \frac{dg(\phi(t))}{d\phi(t)} d\phi(t) = \qquad \text{Eqn. A1.5}$$

-continued $$\left[\phi(t)g(\phi(t)) - \int g(\phi(t)) \cdot 1 \cdot d\phi(t)\right]_0^T = G(\phi(0)) - G(\phi(T)) = 0$$

The first term on the RHS cancels due to the flux being the same at the start and end of the cycle. The integrand on the RHS cancels for the same reason. Q.E.D.

How an Independent Flux Becomes a Dependent Flux if Slew Rate if Low

Figure 24:
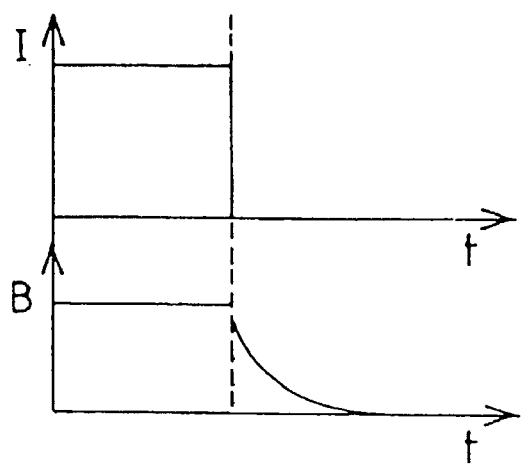
FIG. 24 shows a first graph of current and induction in an exciter coil and a sample embodying the present invention respectively.
Figure 25:
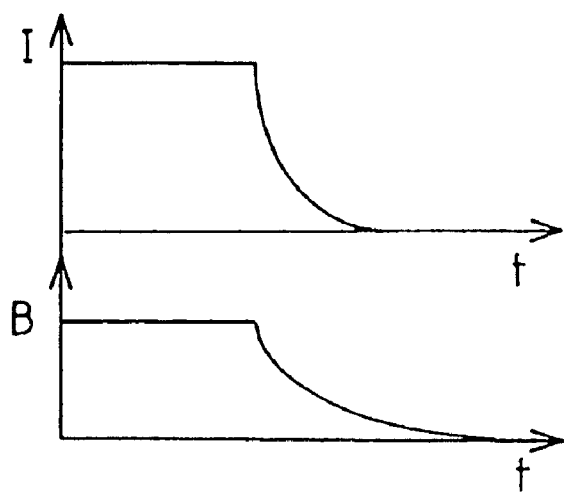
FIG. 25 shows a second graph of current and induction in an exciter coil and a sample embodying the present invention respectively.

Consider the exciter circuit shown in FIGS. 3 and 4. Turning to FIG. 24, shown to the same scale on the time axis are the current in the exciter coil (I) and the induction in the sample (B). Infinite slew of the current is shown and consequently the decaying induction to the right of the switch off point is independent. If, however, the electronic components are slow, the situation shown in FIG. 25 prevails, in which part of the B field is not independent and hence not able to do work in excess of what is put in.

Appendix 2 Background to Magneto-calorific Effect, Ferromagnetism and Paramagnetism Ferromagnetic materials are characterised by several properties: relative permeability greater than unity, spontaneous magnetisation, hysteresis when induction is plotted against incident field—hence domains and the so called Curie Point Temperature above which, the material becomes merely paramagnetic. It is this phase transition to the paramagnetic state that we exploit to turn heat into electricity. First, however, it will be discussed how the spontaneous magnetisation varies with temperature. Within a domain of a ferromagnetic material, the saturation magnetisation is modelled well by the Weiss equation eqn. A2.1. Eqn. A2.2 is the Brillouin function. Eqn. A2.3 is the ratio of average spin to total spin that eqn. A2.1 predicts. H is the applied field and α is the so-called 'Molecular field' related to the exchange interaction between the atoms of the sample.

$$\mu = B_S(h + \alpha\mu) \qquad \text{Eqn. A2.1}$$

$$B_S = \frac{2S+1}{S}\coth\left(\frac{2S+1}{S}x\right) - \frac{1}{2S}\coth\left(\frac{x}{2S}\right) \qquad \text{Eqn. A2.2}$$

$$\mu = \frac{\langle S_Z \rangle}{S} \qquad \text{Eqn. A2.3}$$

$$h = \frac{g\mu_B SH}{K_B T} \qquad \text{Eqn. A2.4}$$

$$\alpha T = \frac{2S^2}{k_B T} pJ \qquad \text{Eqn. A2.5}$$

$\mu_B$ is the 'Bohr magnetron'

$$\mu_B = \frac{|e|\hbar}{2m_e c} \qquad \text{Eqn. A2.6}$$

where
  g is the 'Landé' or 'spectroscopic splitting' factor;
  e is the quantum of electrical charge;
  h is Planck's constant dived by 2π;
  $m_e$ is the mass of the electron,
  c is the speed of light;
  $k_B$ is Boltzmann's constant;

p is the number of nearest neighbours in the lattice; and

J is the exchange energy integral.

Figure 26:
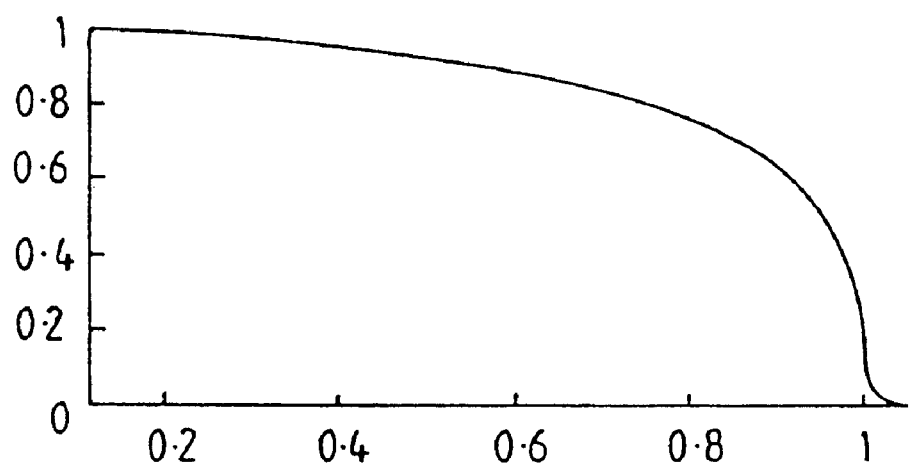
FIG. 26 shows a plot of the Weiss equation for a sample embodying the present invention.

FIG. 26 shows a plot of the first equation (h→0) with $\mu$ normalised against the maximum value it obtains at zero Kelvin and Kelvin temperature and T normalised against the Curie-temperature $T_c$. It shows how the spontaneous magnetisation falls rapidly near the Curie point The Magneto-calorific Effect If a ferromagnetic sample is exposed to a magnetic field adiabatically its temperature will rise; when the field is removed, it will fall back to the original temperature. We can model this as follows:

$$dU = TdS + HdI \qquad \text{Eqn. A2.7}$$

Where H is the magnetic field and I is the magnetisation. If we take S and H as independent variables, double differentiation gives:

$$\frac{\partial^2 U}{\partial H \partial S} = \left(\frac{\partial T}{\partial H}\right)_S = -\left(\frac{\partial I}{\partial S}\right)_H = -\left(\frac{\partial T}{\partial S}\right)_H \left(\frac{\partial I}{\partial T}\right)_H \qquad \text{Eqn. A2.8}$$

By definition, the heat capacity at constant field strength is:

$$c_H = \left(\frac{\delta Q}{\delta T}\right)_H = T\left(\frac{\partial S}{\partial T}\right)_H \qquad \text{Eqn. A2.9}$$

Combining this with the previous equation:

$$c_H = -T\left(\frac{\partial H}{\partial T}\right)_S \left(\frac{\partial I}{\partial T}\right)_H \qquad \text{Eqn. A2.10}$$

or $$(\Delta T)_S = -\frac{T}{c_H}\left(\frac{\partial I}{\partial T}\right)_H \Delta H$$

Figure 27:
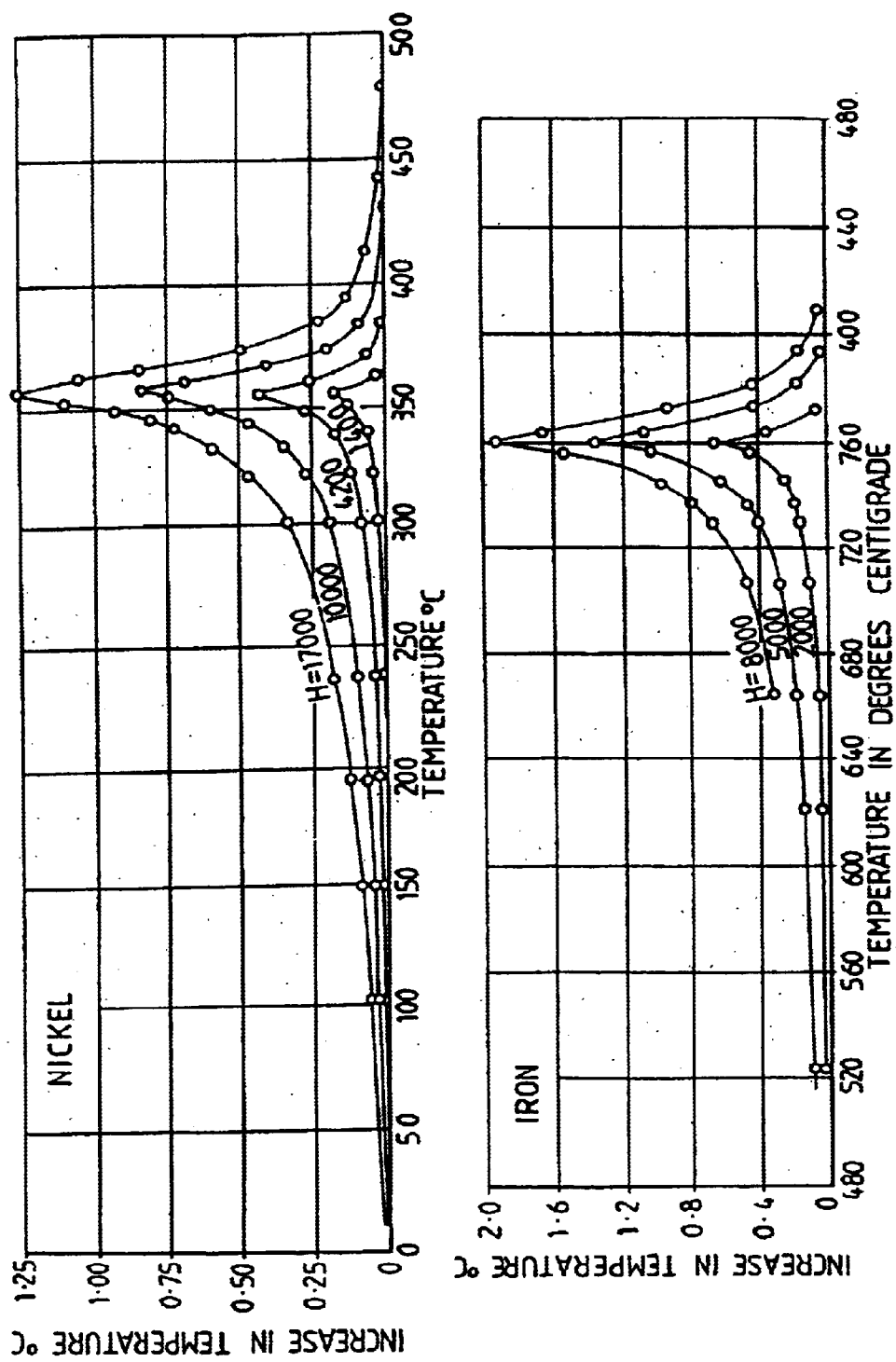
FIG. 27 shows a plot of increase in temperature against temperature for nickel and iron.

The change of magnetisation is at its greatest near the Curie point as the two graphics show below. Plotted in FIG. 27 is the increase in temperature vs. temperature of the sample (° C. both) for Nickel and Iron. The magnetic field shown (H) is measured in Oersteds.

These temperature changes are small, but it will become apparent that the cycle can be repeated many thousands of times per second, and much heat can be converted to electrical energy.

Appendix 3—The Source of Energy on Field Collapse and the Magnitude of Electrical Power Generated Consider a coil and load of resistance. Through the coil is an independent flux $\phi$ that changes and starts a current, i, flowing through the load R. This arrangement can be modelled as the flux being a dipole in a magnetic field caused by current, i, which itself is caused by the flux changing. The change in energy of the core, that which generates the flux is:

$$\Delta U_{core} = -\mu \cdot B \qquad \text{Eqn. A3.1}$$

Hence if the flux changes from being parallel to the axis of the solenoid to being perpendicular thereto, the core loses energy. The changing flux induces a current in the solenoid leading to the expression for B:

$$B = -\frac{n}{\varepsilon_0 c^2}\frac{k}{R}nL\frac{d\phi}{dt} \qquad \text{Eqn. A3.2}$$

Where:

n is the number of turns per unit length;

L is the length of the coil; and k is the coupling coefficient $1 \geq k \geq 0$.

The core can be modelled as a solenoid too, just overlapping the other solenoid of cross-sectional area A and volume V. The magnetic field from this solenoid must be just equal to B (above) from a First Law argument.

The current density through the solenoid is:

$$j = B\varepsilon_0 c^2 \qquad \text{Eqn. A3.3}$$

Hence, the magnetic moment is:

$$\mu = \int_0^L j \cdot A \, dl = jV \qquad \text{Eqn. A3.4}$$

The energy dissipated in the resistor is hence:

$$\Delta U_R = B\varepsilon_0 c^2 V \cdot \frac{n}{\varepsilon_0 c^2}\frac{k}{R}nL\frac{d\phi}{dt} \qquad \text{Eqn. A3.5}$$

$$= \frac{n^2 k}{R} V^2 B \frac{dB}{dt}$$

If the thermodynamic cycle is completed F times per second, the rate of change of B must at least be B divided by the period, thus:

$$\text{Minimum Power} = \frac{n^2 k}{R} V^2 B^2 F^2 \qquad \text{Eqn. A3.6}$$

What is claimed is:

1. An apparatus for performing a thermodynamic cycle, comprising:

a sample that exhibits temporary magnetic remanence; and means to magnetise the sample within a time period that is less than one tenth of the duration of the cycle, the duration of the cycle being less than one ten thousandth of a second, wherein demagnetisation of the sample causes the generation of an independent magnetic flux.

2. An apparatus according to claim 1, wherein the sample comprises a material which cools during a first portion of the demagnetisation thereof.

3. An apparatus according to claim 2, wherein the sample comprises a material in which the temperature of the sample increases during a second portion of the demagnetisation thereof.

4. An apparatus according to claim 1, wherein the sample comprises a ferrofluid.

5. An apparats according to claim 1, which further comprises a circulation system comprising micro-encapsulated material whose melting point is close to an operational temperature range of the sample.

6. An apparatus according to claim 1, further comprising means to convert at least some of the independent magnetic flux into an electric current.

7. An apparatus according to claim 1, wherein the sample is of a first permeability, and wherein a quantity of a material having a second permeability is provided adjacent the sample, the first permeability being lower than the second permeability.

8. An apparatus according to claim 1, wherein the means to magnetise the sample comprises a flow of electric current.

9. An apparatus according to claim 1, wherein the means to magnetise the sample comprises at least one rotating permanent magnet.

10. A method of converting energy, comprising the steps of:
   providing a sample that exhibits temporary magnetic remenance;
   magnetising the sample, thereby causing the sample to become magnetised in a time period that is less than one tenth of the duration of the cycle, the duration of cycle being less than one ten thousandth of a second;
   allowing the sample to demagnetise, the demagnetisation of the sample causing an independent magnetic flux; and
   converting at least some of the independent magnetic flux into an electric current.

11. A method according to claim 10, wherein the step of providing a sample comprises the step of providing a ferrofluid.

12. A method according to claim 10, wherein the step of providing a sample comprises the step of providing a sample having a fi&t permeability, and further providing a quantity of a material having a second permeability adjacent the sample, the first permeability being higher than the second permeability.

13. A method according to claim 10, wherein at least one rotating permanent magnet magnetises the sample.

14. A method according to claim 10, wherein a carrier operable to carry a flow of electric current therethrough magnetises the sample.

15. A method according to claim 10, wherein the magnetising step and the converting step are carried out by a single means operable to magnetise the sample and to convert at least some of the independent magnetic flux into an electric current.

16. A method according to claim 10, further comprising the step of providing a circulation system comprising microencapsulated material whose melting point is close to an operational temperature range of the sample.

17. A method of producing an electric current, comprising the steps of
   providing a sample that exhibits temporary magnetic remenance;
   magnetising the samples thereby causing the sample to become magnetised in a time period that is less than one tenth of the duration of the cycle, the duration of cycle being less than one ten thousandth of a second;
   allowing the sample to demagnetise, the demagnetisation of the sample causing an independent magnetic flux; and
   converting at least some of the independent magnetic flux into an electric current.

18. A method of refrigeration, the power therefor being partially provided by the method of claim 17.

19. An apparatus for performing a thermodynamic cycle, comprising:
   a sample that exhibits temporary magnetic remenence; and
   means to magnetise the sample within a time period that is less than one tenth of the duration of the cycle, the duration of the cycle being less than one ten thousandth of a second, wherein
   demagnetisation of the sample causes the generation of an independent magnetic flux.

* * * * *